(12) United States Patent
Tsukahara

(10) Patent No.: US 6,531,022 B1
(45) Date of Patent: Mar. 11, 2003

(54) MOUNTING METHOD OF SEMICONDUCTOR ELEMENT

(75) Inventor: Norihito Tsukahara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/528,116

(22) Filed: Mar. 17, 2000

Related U.S. Application Data

(63) Continuation of application No. 09/011,603, filed as application No. PCT/JP97/01971 on Jun. 6, 1997, now Pat. No. 6,051,093.

(30) Foreign Application Priority Data

Jun. 7, 1996 (JP) .............................................. 8-145241

(51) Int. Cl.⁷ .......................... B32B 31/00; H01L 21/00
(52) U.S. Cl. .................... 156/256; 156/261; 156/273.5; 156/298; 156/299; 156/305; 156/306.6; 156/306.9; 228/180.22; 427/96; 427/97; 29/832; 29/852
(58) Field of Search ................................ 156/267, 305, 156/261, 306.6, 251, 263, 273.5, 306.9, 298, 299; 29/852, 832; 427/96, 97; 228/180.22

(56) References Cited

U.S. PATENT DOCUMENTS

| | | | |
|---|---|---|---|
| 5,014,111 A | 5/1991 | Tsuda et al. ................. 257/737 |
| 5,274,916 A | 1/1994 | Kawabata et al. ............ 29/848 |
| 5,384,952 A | 1/1995 | Matsui ......................... 29/840 |
| 5,407,864 A | 4/1995 | Kim ............................. 29/834 |
| 5,615,477 A | 4/1997 | Sweitzer ...................... 29/840 |
| 5,843,251 A | 12/1998 | Tsukagoshi et al. .......... 156/64 |
| 5,848,466 A | 12/1998 | Viza et al. .................... 29/840 |

FOREIGN PATENT DOCUMENTS

| | | |
|---|---|---|
| EP | 0 482 940 | 4/1992 |
| EP | 0 735 579 | 10/1996 |
| JP | 60126856 | 7/1985 |
| JP | 01198040 | 8/1989 |
| JP | 1-198040 | 8/1989 |
| JP | 4-137641 | 5/1992 |
| JP | 5-267394 | 10/1993 |
| JP | 6-69278 | 3/1994 |
| JP | 06069278 | 3/1994 |

OTHER PUBLICATIONS

Japanese language search report for Int'l Appln No. PCT/JP97/01971 dated Dec. 8, 1997.
European Search Report for Int'l Appln No. 97925302.8 dated Feb. 26, 1999.
English translation of Form PCT/IS/210 (no date available).
"Solderless Assembly Method for Semiconductor Carriers" IBM Technical Bulletin vol. 35 No. 3 Aug. 1992, pp. 130–131.

Primary Examiner—Linda Gray
(74) Attorney, Agent, or Firm—RatnerPrestia

(57) ABSTRACT

A mounting method of a semiconductor element capable of joining an electrode of a semiconductor element and a circuit board at high reliability. The method includes a step of forming an external electrode terminal by filling a hole formed in circuit board with a conductive paste, a step of positioning the external electrode terminal and a protruding bump formed on an electrode of a semiconductor, and a step of pressing the semiconductor element to contact between the conductive paste in the hole and the protruding bump thereby electrically connecting the electrode of the semiconductor element and the external electrode terminal of the circuit board. An adhesive sheet of a thermosetting resin, a thermoplastic resin, or a mixed thermosetting and thermoplastic resin may be disposed on the circuit board where the bump breaks through the sheet to contact the paste.

12 Claims, 14 Drawing Sheets

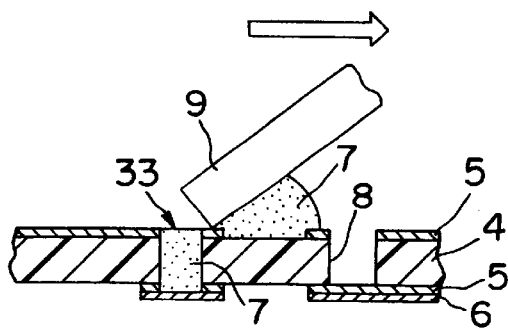
F I G. 2(a)
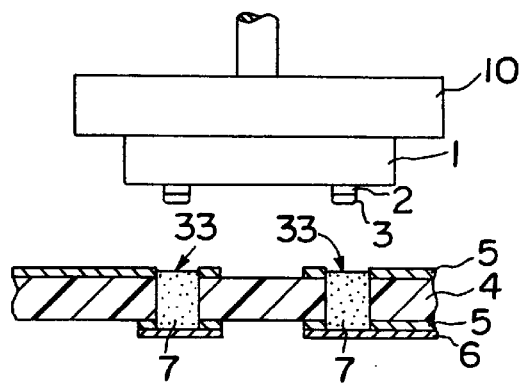
F I G. 2(b)
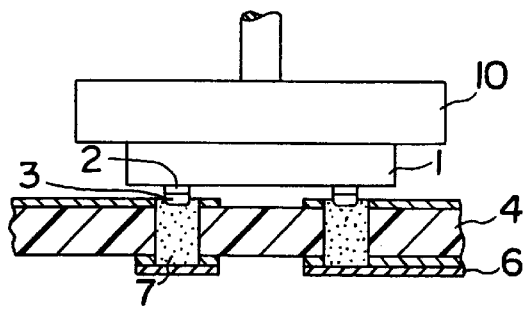
F I G. 2(c)
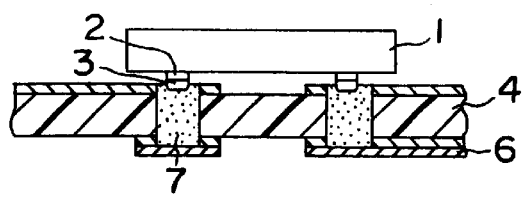
F I G. 2(d)

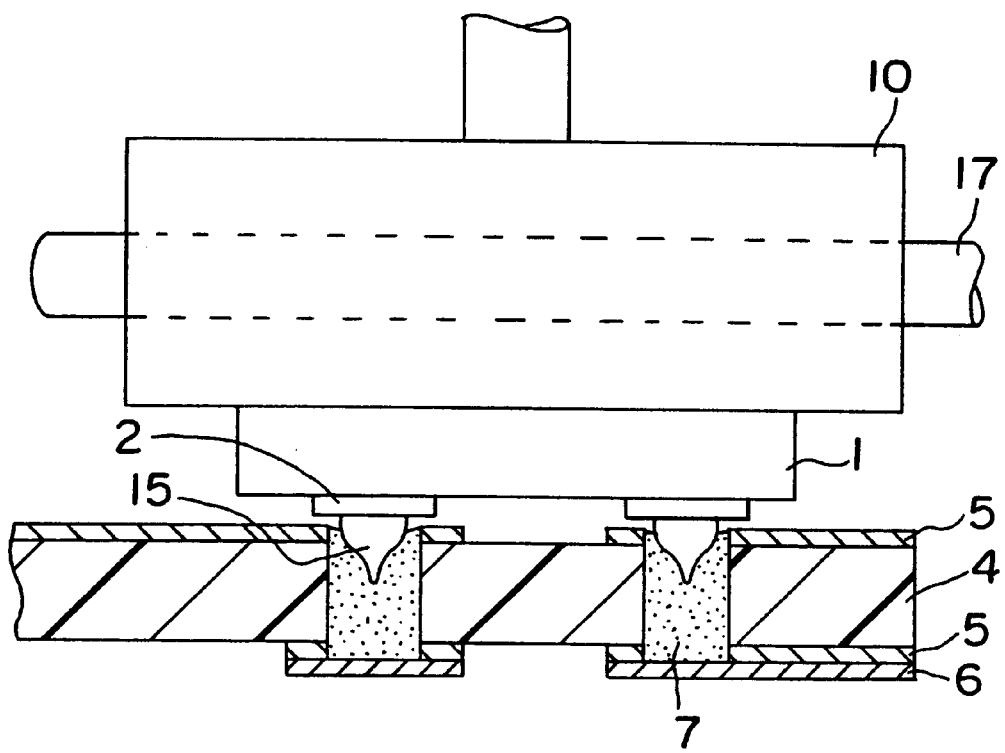
F I G. 9
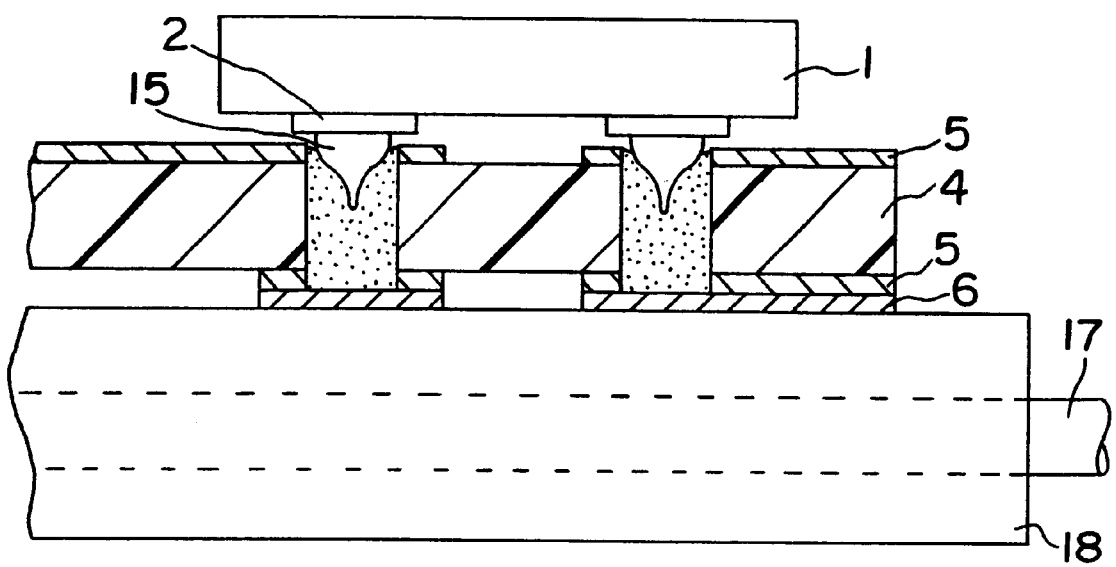
F I G. 10

MOUNTING METHOD OF SEMICONDUCTOR ELEMENT

This application is a continuation of U.S. patent application Ser. No. 09/011,603, filed Feb. 6, 1998 now U.S. Pat. No. 6,051,093 which is a 371 of PCT/JP97/01971, filed Jun. 6, 1997.

TECHNICAL FIELD

The present invention relates to a mounting method of semiconductor element for mounting a flip chip type semiconductor element on a circuit board of semiconductor element at high reliability and high density.

BACKGROUND ART

Conventional mounting methods of semiconductor element are described below by referring to the drawings.

(Prior Art 1)

FIG. 16 is a sectional view of mounting a semiconductor element on a circuit board in prior art 1.

In FIG. 16, reference numeral 1 is a semiconductor element, an electrode 2 is formed on the semiconductor element 1, and a protruding bump (metal ball bump) 15 made of gold, copper, aluminum, solder or the like is formed on the electrode 2 by wire bonding method.

Reference numeral 4 is a circuit board made of an insulating substrate, and a copper foil 5 to be used as wiring is formed on this circuit board 4, and a copper-plated external electrode terminal 6 is formed on the circuit board 4. To conduct within the circuit board, a hole 8 formed in the circuit board 4 is filled with conductive paste 7.

Reference numeral 22 is a conductive paste (conductive adhesive) having conductive powder of silver, gold, nickel, carbon or the like dispersed uniformly on phenol or epoxy resin. The external electrode terminal 6 of the circuit board 4 and the electrode 2 of the semiconductor element 1 are electrically connected with each other through the protruding bump 15. The space between the circuit board 4 and semiconductor element 1 is filled with epoxy resin 20.

A mounting method of thus constituted semiconductor device is described below.

The conductive paste 22 is transferred on the protruding bump 15 formed on each electrode 2 of the semiconductor element 1 by transfer method, it is mounted so that the protruding bump 15 may coincide with the external electrode terminal 6 of the circuit board 4 to be mounted, and then it is heated to cure the conductive paste 22. In this way, the electrode 2 of the semiconductor element 1 and the external electrode terminal 6 of the circuit board 4 are electrically connected. After the connection, the space between the semiconductor element 1 and circuit board 4 is filled with the epoxy resin 20, and by making use of the shrinking force of its curing, continuous contact of the conductive powder of the conductive paste 22 is obtained, so that electrical and mechanical reliability is assured.

(Prior Art 2)

FIG. 17 is a sectional view of mounting a semiconductor element on a circuit board in prior art 2. Same parts as in the constitution in FIG. 16 are identified with same reference numerals and their explanation is omitted.

In FIG. 17, reference numeral 23 is a metal bump formed on an electrode 2 by electric plating method, and the metal bump 23 is, for example, plated with copper and further plated with gold 24. Reference numeral 25 is an external electrode terminal, and 16 is a passivation film for protecting the active surface of the semiconductor element 1.

A mounting method of thus constituted semiconductor device is described below.

The conductive paste 22 is transferred on the metal bump 23 formed on each electrode 2 of the semiconductor element 1 by transfer method, it is mounted so that the metal bump 23 may coincide with the external electrode terminal 25 of the circuit board 4 to be mounted, and then it is heated to cure the conductive paste 22. In this way, the electrode 2 of the semiconductor element 1 and the external electrode terminal 25 of the circuit board 4 are electrically connected. After the connection, the space between the semiconductor element 1 and circuit board 4 is filled with the epoxy resin 20, and by making use of the shrinking force of its curing, continuous contact of the conductive powder of the conductive paste 22 is obtained, so that electrical and mechanical reliability is assured.

(Prior Art 3)

FIG. 18 is a sectional view of mounting a semiconductor element on a circuit board in prior art 3. Same parts as in the constitution in FIG. 16 and FIG. 17 are identified with same reference numerals and their explanation is omitted.

In FIG. 18, reference numeral 3 is a protruding bump (protruding electrode) formed on an electrode 2 by plating method, and 26 is an insulating adhesive film, and conductive particles 27 of nickel, solder, carbon, or the like are uniformly dispersed in the insulating adhesive film 26.

A mounting method of thus constituted semiconductor device is described below.

The insulating adhesive film 26 is positioned between the semiconductor element 1 and external electrode terminal 25 of the circuit board 4, and heated and pressurized simultaneously. As a result, the adhesive film 26 is melted to flow into the space in the electrode 25, the conductive particles 27 are fixed and held by the protruding pump 3 and external electrode terminal 25, so that the protruding bump 3 and external electrode terminal 25 conduct. In the space, on the other hand, the conductive particles 27 remain dispersed in the adhesive, and the insulation is maintained. The adhesive film 26 is cured when cooled, and the semiconductor element 1 and circuit board 4 are fixed, and the connection reliability is assured.

In the mounting method of semiconductor element in prior art 1 (or prior art 2), however, as shown in FIG. 19, when transferring the conductive paste film 28 on the protruding bump 15 by transfer method and joining the bump 15 to the external electrode 6 of the circuit board 4, it is hard to control the amount of the conductive paste 22 to be transferred, and if the amount of the paste 22 is slightly excessive, a short circuit 30 may be formed in the electrode 2 by the conductive paste 22. Or if the circuit board 4 is slightly warped, the electrode 2 of the semiconductor element 1 and the external electrode terminal 6 of the circuit board 4 do not contact with each other through the conductive paste 22, and it is electrically open between the electrode 2 and external electrode terminal 6.

Further, as shown in FIG. 20, when filling the space between the semiconductor element 1 and circuit board 4 with epoxy resin 20, the epoxy resin 20 contained in a syringe 31 is injected from the periphery of the semiconductor element 1, and it takes more than 10 minutes to inject, and it was a bottleneck for shortening the cycle time of production line of semiconductor element 1.

In the mounting method of semiconductor element in prior art 3, since conduction is achieved by fixing and holding the conductive particles 27 between the electrode 2 of the semiconductor element 1 and electrode 25 of the circuit board 4, if the circuit board 4 is slightly warped or curved A as shown in FIG. 21, the conductive particles 27 remain dispersed in the adhesive 26, and the protruding bump 3 of the semiconductor element 1 and the electrode 25 of the circuit board 4 do not contact with each other, and hence it is electrically open between the protruding bump 3 and electrode 25. In the mounting method of prior art 3, incidentally, it is applied to a glass substrate which is hardly warped or curved, and is not applied to resin substrate.

It is hence an object of the invention to present a mounting method of semiconductor element free from occurrence of defects such as short circuit or open state between electrodes, capable of mounting at high electric reliability, curtailing the time substantially in the sealing process, and shortening the cycle time of semiconductor production line.

DISCLOSURE OF THE INVENTION

To achieve the above object, the mounting method of semiconductor element of the invention comprises a step of forming a hole in a position of a circuit board for connecting a circuit of the circuit board and an electrode of a semiconductor element, a step of filling the hole with a conductive paste for forming an external electrode terminal, a step of forming a protruding bump on the electrode of the semiconductor element, a step of positioning the external electrode terminal and the protruding bump formed on the electrode of the semiconductor element, and a step of pressing the semiconductor element to contact between the conductive paste in the hole and the protruding bump, thereby electrically connecting the electrode of the semiconductor element and the external electrode terminal of the circuit board.

In this mounting method of semiconductor element, the conductive paste charged in the hole of the circuit board and the protruding bump formed on the electrode of the semiconductor element are brought to contact with each other, and the electrode of the semiconductor element and the external electrode terminal of the circuit board are electrically connected, so that mounting of high electrical reliability is achieved without causing defects such as short circuit or open state between the electrodes.

BRIEF DESCRIPTION OF THE DRAWINGS

FIGS. 2(a)–2(d) is a diagram showing mounting steps sequentially in embodiment 1 of the invention.

FIG. 9 is a diagram showing mounting steps sequentially in embodiment 3 of the invention.

FIG. 10 is a diagram showing mounting steps sequentially in embodiment 4 of the invention.

BEST MODE FOR CARRYING OUT THE INVENTION

Figure 1:
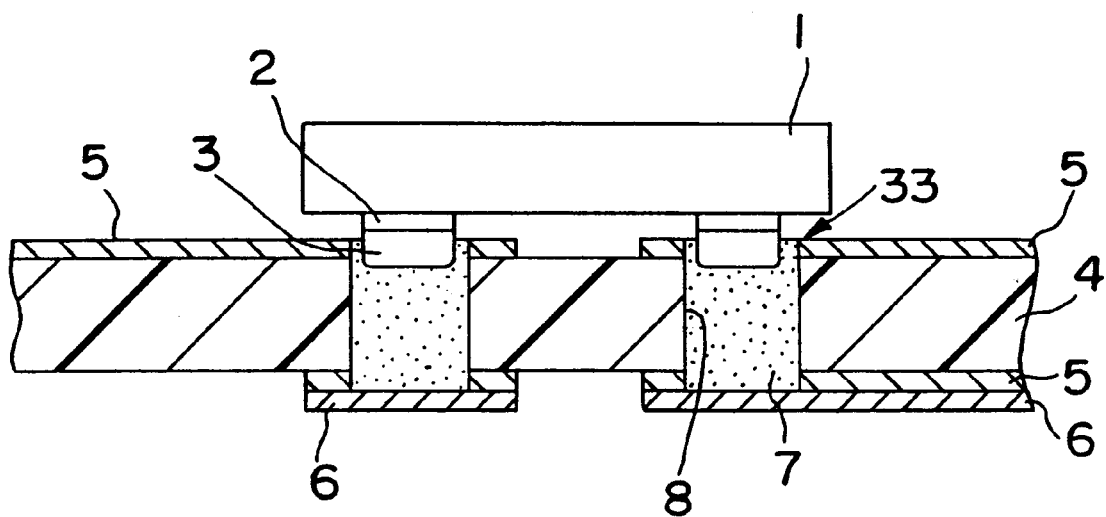
FIG. 1 is a junction sectional view of a semiconductor element and a circuit board after mounting in embodiment 1 of the invention.

The invention as set forth in the claims is a mounting method of semiconductor element comprising a step of forming a hole in a position of a circuit board for connecting a circuit of the circuit board and an electrode of a semiconductor element, a step of filling the hole with a conductive paste for forming an external electrode terminal, a step of forming a protruding bump on the electrode of the semiconductor element, a step of positioning the external electrode terminal and the protruding bump formed on the electrode of the semiconductor element, and a step of pressing the semiconductor element to contact between the conductive paste in the hole and the protruding bump, thereby electrically connecting the electrode of the semiconductor element and the external electrode terminal of the circuit board. According to this method, the protruding bump contacts with the conductive paste in the hole of the circuit board, and is electrically connected, and hence open state or short circuit does not occur.

The invention as set forth in the claims relates to a mounting method of semiconductor element of the claims, in which the protruding bump formed on the electrode of the semiconductor element is a metal ball bump formed by wire bonding method. When the protruding bump is formed by electric plating method, the height of the formed bump is about 25 microns at maximum, whereas the wire bonding method can form the bump as high as 50 microns or more, so that the amount of the bump filled with the conductive paste in the hole in the circuit board increases, and mounting of higher reliability is realized.

The invention as set forth in the claims relates to a mounting method of semiconductor element of the claims, which further comprises a step of, after pressing the semiconductor element to contact between the conductive paste charged in the hole of the circuit board and the protruding bump on the electrode of the semiconductor element, heating at least one of the semiconductor element and the circuit board by a heating tool, thereby curing the conductive paste. By curing the conductive paste, fixing of the semiconductor element and circuit board is stronger, and the junction is higher in reliability. Moreover, as compared with the conventional curing of the conductive paste in batch process by putting the module in an oven, it can be done simultaneously with joining in the same equipment in the method of the invention, so that the cycle time of production line of semiconductor element can be shortened.

The invention as set forth in the claims relates to a mounting method of semiconductor element of any one of the claims, which further comprises a step of, after connecting the electrode of the semiconductor element and the external electrode terminal of the circuit board, pouring an epoxy resin into the space between the semiconductor element and the circuit board, and sealing. Since the active surface of the semiconductor element and the electrode surface are protected by the epoxy resin, the reliability of connection is further increased.

The invention as set forth in the claim is a mounting method of semiconductor element comprising a step of forming a hole in a position of a circuit board for connecting a circuit of the circuit board and an electrode of a semiconductor element, a step of filling the hole with a conductive paste for forming an external electrode terminal, a step of forming a protruding bump on the electrode of the semiconductor element, a step of disposing an adhesive sheet having a thermosetting resin, a thermoplastic resin, or a mixed thermosetting and thermoplastic resin, on the circuit board forming the external electrode terminal or the protruding bump of the semiconductor element, a step of positioning the external electrode terminal and the protruding bump formed on the electrode of the semiconductor element, a step of pressing the semiconductor element to break through the adhesive sheet by the protruding bump so as to contact between the conductive paste in the hole and the protruding bump, thereby electrically connecting the electrode of the semiconductor element and the external electrode terminal of the circuit board, and a step of heating the semiconductor element by a heating tool to melt and cure the adhesive sheet. According to the method, since the adhesive sheet protects the active surface of the semiconductor element and the electrode surface after melting and curing, the reliability of connection is increased. Further, in the case of using the adhesive sheet, the time required for pressurizing and curing is about 30 seconds, whereas the curing time is about 4 hours in the conventional method by using the epoxy resin, and therefore since the curing time in this method is very short, the cycle time of production line of semiconductor element is shortened.

Figure 16:
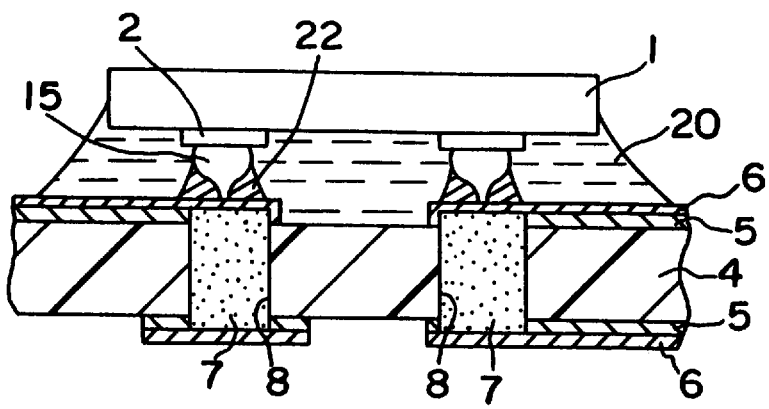
FIG. 16 is a junction sectional view of a semiconductor element and a circuit board after mounting in a conventional mounting method of semiconductor element.
Figure 17:
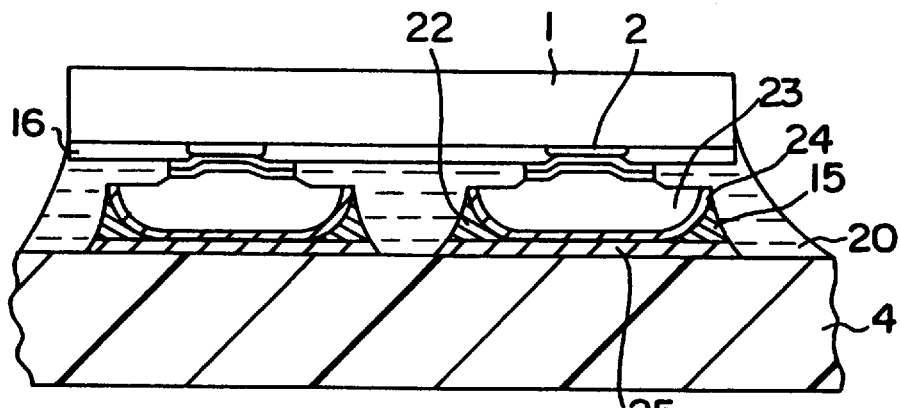
FIG. 17 is a junction sectional view of a semiconductor element and a circuit board after mounting in a conventional mounting method of semiconductor element.
Figure 18:
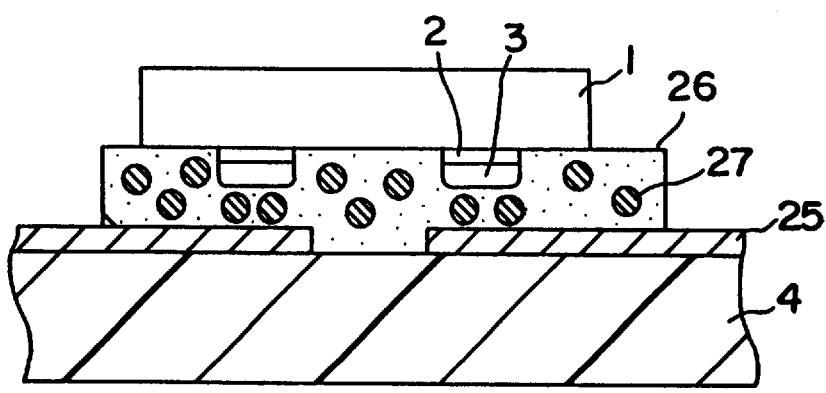
FIG. 18 is a junction sectional view of a semiconductor element and a circuit board after mounting in a conventional mounting method of semiconductor element.
Figure 19A:
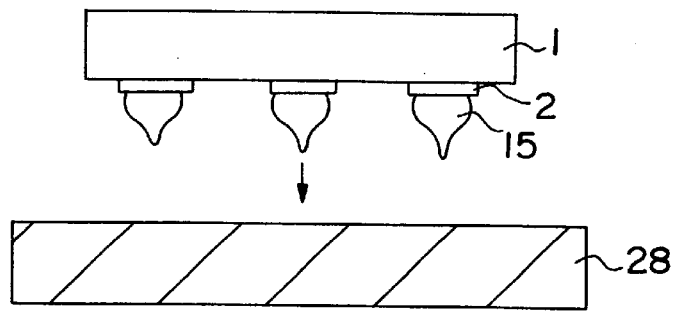
FIGS. 19(a)–19(d) is a diagram showing conventional mounting steps sequentially.
Figure 19B:
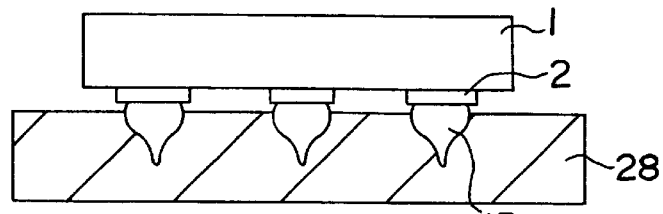
Figure 19C:
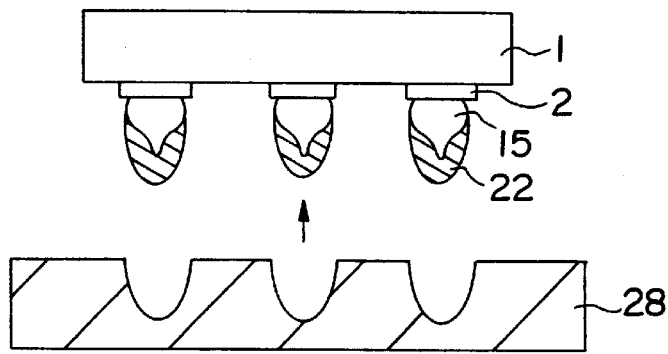
Figure 19D:
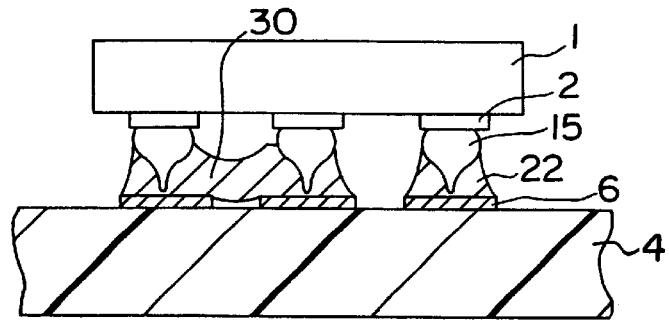
Figure 20:
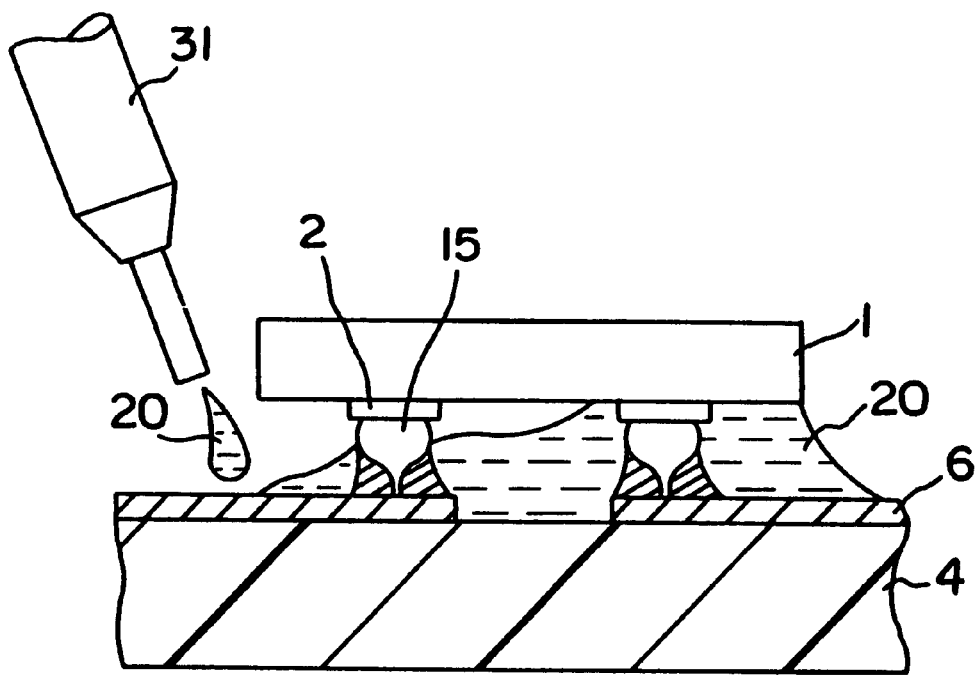
FIG. 20 is a diagram for explaining a problem of a conventional mounting method.
Figure 21:
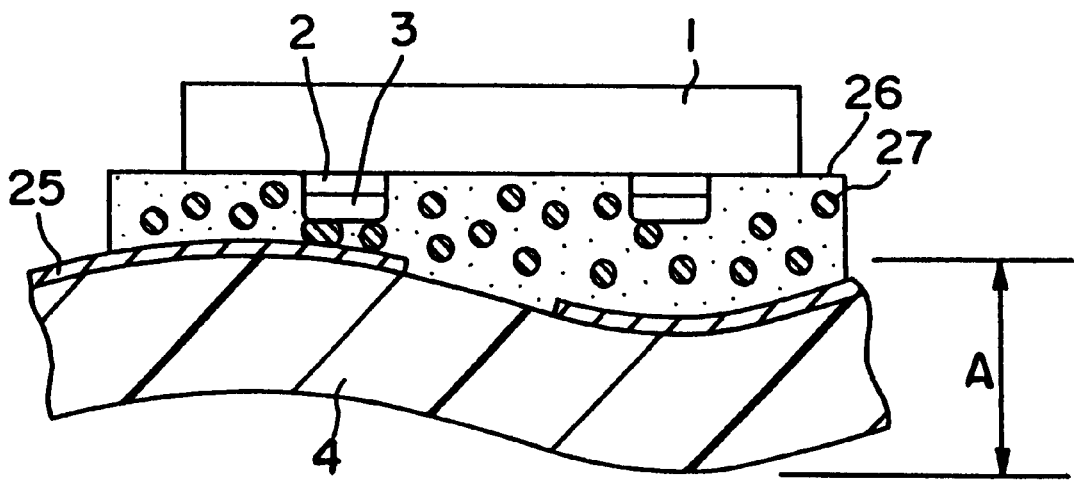
FIG. 21 is a diagram for explaining a problem of a conventional mounting method.

Referring now to the drawings, embodiments of the invention are described below. Same parts as in the constitution in FIG. 16 to FIG. 18 showing prior arts are identified with same reference numerals, and their explanation is omitted.

(Embodiment 1)

FIG. 1 is a sectional view of a circuit board mounting a semiconductor element in embodiment 1 of the invention.

As shown in the diagram, a protruding bump 3 formed on an electrode 2 of a semiconductor element 1 contacts, as being buried in, with a conductive paste 7 filling up a hole 8 of a circuit board 4, so that an external electrode terminal 6 of the circuit board 4 and the electrode 2 of the semiconductor element 1 are electrically connected. Referring to a process diagram in FIG. 2, a mounting method of semiconductor element of the invention is described below.

First, the external electrode terminal 6 of the circuit board 4 and the electrode 2 of the semiconductor element 1 are connected. The hole 8 is formed in a position of the circuit board 4, and the conductive paste 7 is printed in to fill up the hole 8 of the circuit board 4 by moving a squeegee 9 as shown in FIG. 2(a), and thus an external electrode terminal 33 of the circuit board 4 is formed.

Next, as shown in FIG. 2(b), the semiconductor element 1 is attracted to a suction nozzle 10, and the protruding bump 3, and the external electrode terminal 33 of the circuit board 4 formed by the conductive paste 7 filling up the hole 8 are positioned.

Then, as shown in FIG. 2(c), pressing the semiconductor element 1 by the suction nozzle 10, the protruding bump 3 is buried into the conductive paste 7 filling up the hole 8 of the circuit board 4 as shown in FIG. 2(d).

As a result, the protruding bump 3 of the semiconductor element 1 contacts with the conductive paste 7 in the hole of the circuit board 4, and they are electrically connected.

Figure 3:
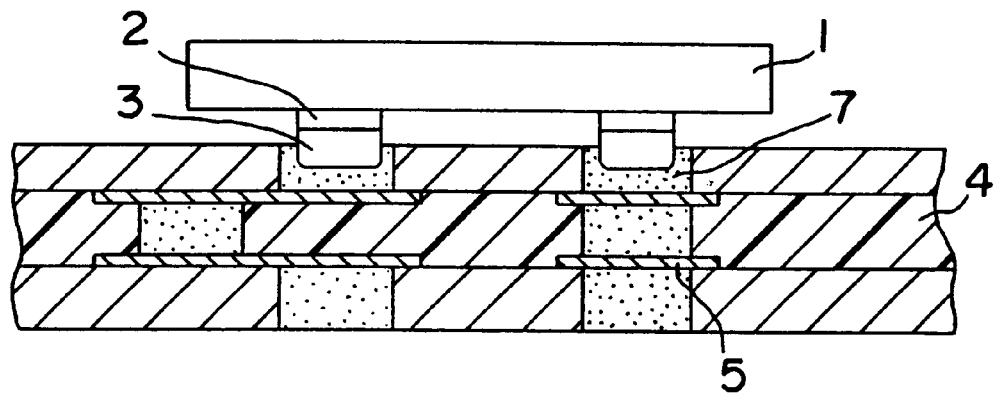
FIG. 3 is a junction sectional view of a semiconductor element and a circuit board after mounting in embodiment 1 of the invention.
Figure 4:
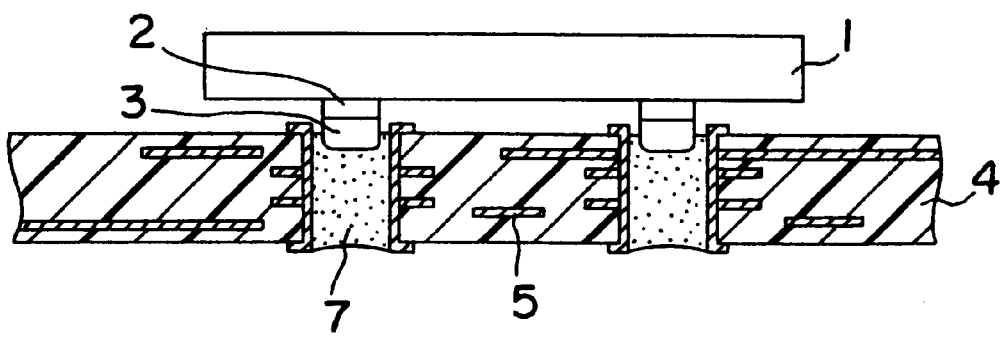
FIG. 4 is a junction sectional view of a semiconductor element and a circuit board after mounting in embodiment 1 of the invention.

Alternatively, the circuit board 4 may be also a multi-layer substrate conducting between layers in the substrate by inner via holes as shown in FIG. 3, or the circuit board 4 may be also a multi-layer substrate conducting between layers by through holes as shown in FIG. 4.

According to this embodiment 1, since the protruding bump 3 formed on the electrode 2 of the semiconductor element 1 is buried in the conductive paste 7 in the hole 8 of the circuit board 4, and contacts to be connected electrically, short circuit is not formed, and the tolerable range for warping and curving of the circuit board 4 is extended, and open state does not occur, so that the semiconductor element 1 and the circuit board 4 may be joined at high reliability.

(Embodiment 2)

FIG. 5 is a process diagram showing a forming method of a protruding bump on an electrode of a semiconductor element by employing a wire bonding method according to embodiment 2 of the invention, and the wire bonding method is described below while referring to FIG. 5.

Figure 5A:
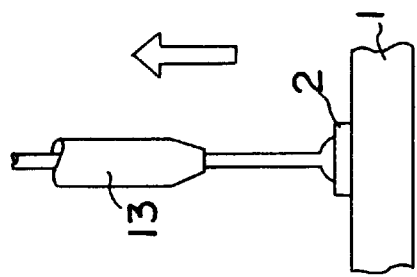
FIGS. 5(a)–5(f) is a diagram showing steps of wire bonding method sequentially in embodiment 2 of the invention.

First, as shown in FIG. 5(a), a metal wire 11 made of gold, copper, aluminum, solder or the like is passed through a capillary 13 made of ceramic or ruby, and a metal ball 12 is formed by electric discharge between the end of the passed metal wire 11 and an electrode 14 called torch.

Figure 5D:
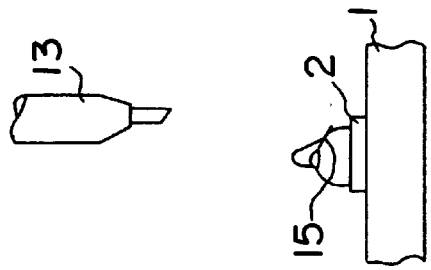
Figure 5B:
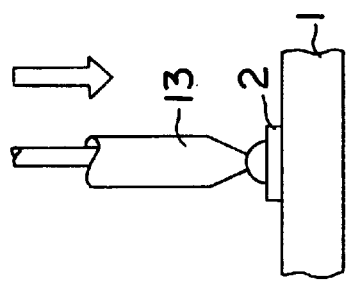

Next, as shown in FIG. 5(b), the metal ball 12 is pressed on an electrode 2 of a preheated semiconductor element 1, and ultrasonic vibrations are applied. Thus, by the action of temperature, pressure and ultrasonic vibrations, the metal ball 12 is joined to the electrode 2.

Figure 5E:
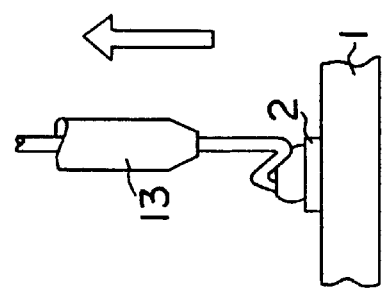
Figure 5C:
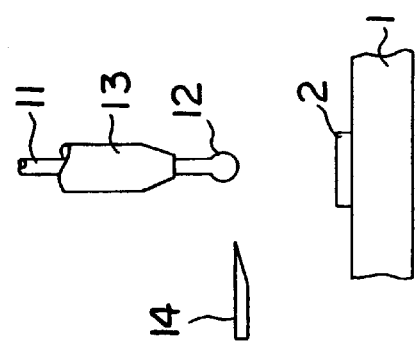
Figure 6:
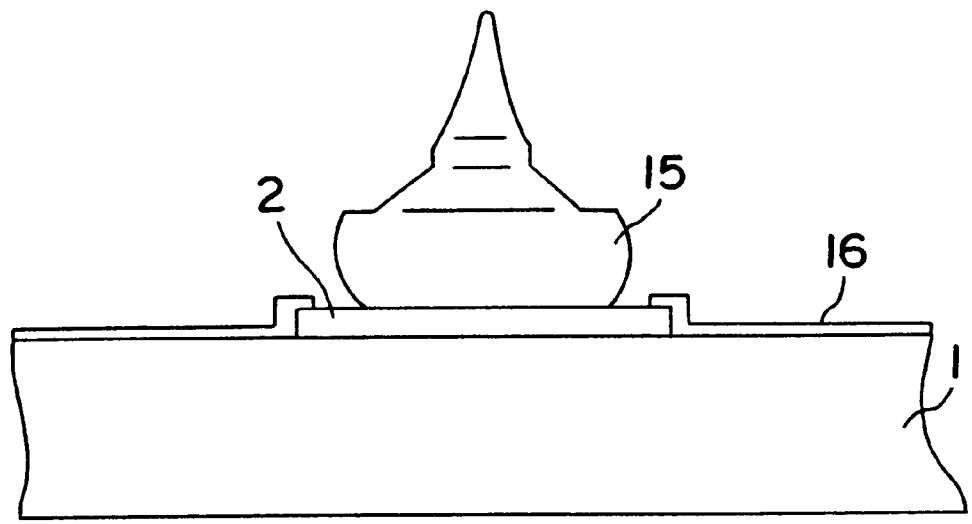
FIG. 6 is a side view of a protruding bump formed by the wire bonding method in embodiment 2 of the invention.

Then, as shown in FIG. 5(c), the capillary 13 is lifted in the perpendicular direction, and the metal wire 11 is torn off, and a bump 15 is formed by metal ball as shown in FIG. 6.

In succession, as shown in FIG. 5(d), after lifting the capillary 13, the capillary 13 is shifted sideways and lowered without tearing the metal wire 11, and the metal wire 11 is brought contact onto the metal ball 12, and by the action of temperature and pressure, or temperature, pressure and ultrasonic vibrations, the metal wire 11 is joined to the metal ball 12.

Figure 5F:
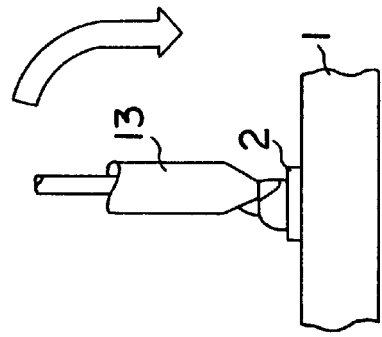
Figure 7:
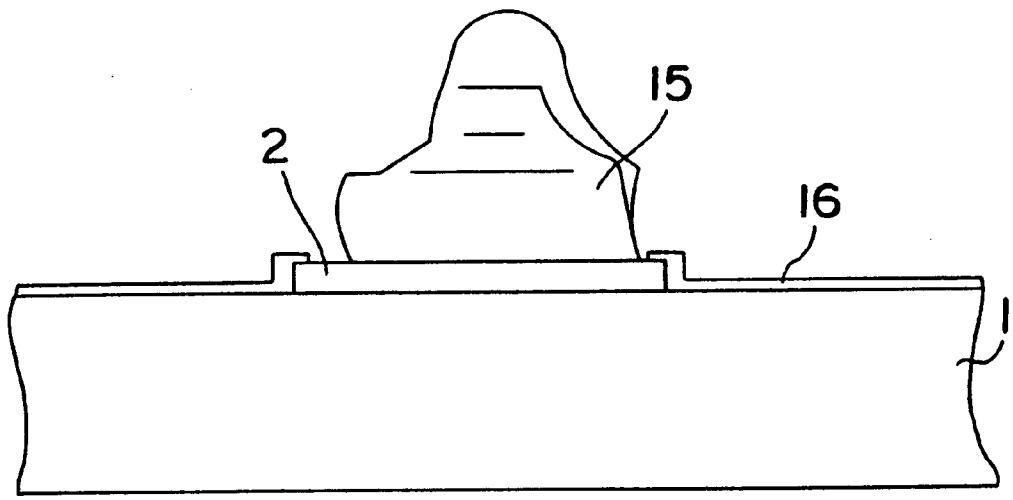
FIG. 7 is a side view of a two-stage protruding bump formed by the wiring bonding method in embodiment 2 of the invention.

Consequently, as shown in FIG. 5(e), the capillary 13 is lifted, the metal wire 11 is torn off, and a two-stage protruding bump 15 is formed by metal ball as shown in FIG. 5(f) and FIG. 7.

After forming the protruding bump 15 by metal ball on the electrode 2 of the semiconductor element 1 in this method, the semiconductor element 1 and the circuit board 4 are joined in the method shown in FIG. 8.

The mounting method in FIG. 8 is same as the method explained in embodiment 1, and its explanation is omitted.

Figure 8A:
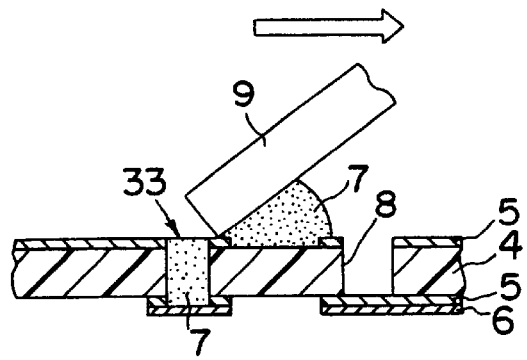
FIGS. 8(a)–8(d) is a diagram showing mounting steps sequentially in embodiment 2 of the invention.
Figure 8B:
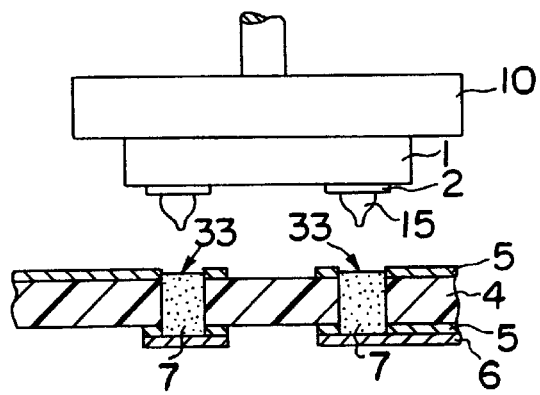
Figure 8C:
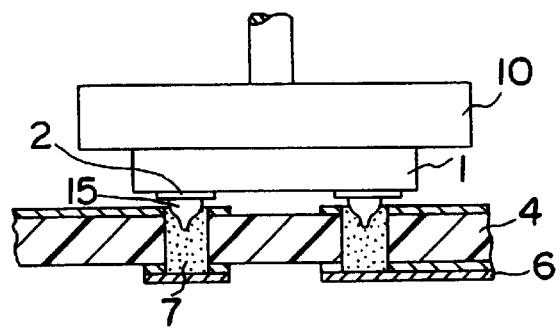
Figure 8D:
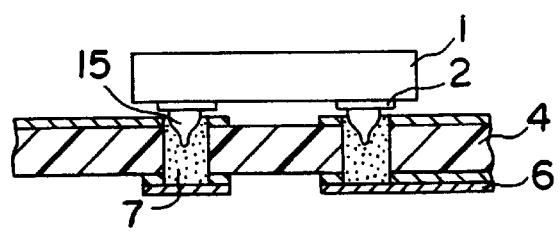

In this embodiment 2, in addition to the effects of embodiment 1, a high bump of 50 microns or more can be formed by the wire bonding method of the embodiment, as compared with the maximum height of about 25 microns of the protruding bump formed by the conventional electric plating method, and therefore, as shown in FIGS. 8(c) and 8(d), the amount of the bump 15 buried in the conductive paste 7 in the hole 8 of the circuit board 4 is increased, and the tolerable range for warping and curving of the circuit board 4 is extended, so that mounting of higher reliability is realized.

(Embodiment 3)

A mounting method of semiconductor element in embodiment 3 of the invention is described below while referring to FIG. 9.

In FIG. 9, a semiconductor element 1 is attracted to a suction nozzle 10, and is positioned to an external electrode terminal of a circuit board 4 forming a protruding bump by conductive paste 7 filling up a hole 8, and they are pressed, and the protruding bump is buried in the conductive paste 7. At this time, the suction nozzle 10 is heated by an incorporated heater 17, and the conductive paste 7 is cured simultaneously with pressing.

According to this embodiment, in addition to the effects of the foregoing embodiments 1 and 2, by curing the conductive paste 7, fixing of the semiconductor element 1 and circuit board 4 is stronger, and highly junction is obtained. Moreover, conventionally, the conductive paste 7 was cured by batch treatment by putting the module in an oven, but it can be done in the same equipment simultaneously with joining in the method of the embodiment, and therefore the cycle time of production line of the semiconductor element 1 can be shortened.

(Embodiment 4)

A mounting method of semiconductor element in embodiment 4 of the invention is described below while referring to FIG. 10.

In FIG. 10, a semiconductor element 1 is attracted to a section nozzle 10, and is positioned to an external electrode terminal 33 of a circuit board 4 forming a protruding bump by conductive paste 7 filling up a hole 8, and they are pressed, and the protruding bump is buried in the conductive paste 7. At this time, a stage 18 holding the circuit board 4 is heated by an incorporated heater 17, and by heating when pressing the semiconductor element 1, the conductive paste 7 is cured simultaneously with pressing.

According to this embodiment 4, in addition to the effects of the foregoing embodiments 1 and 2, by curing the conductive paste 7, fixing of the semiconductor element 1 and circuit board 4 is stronger, and highly reliable junction is obtained. Moreover, conventionally, the conductive paste 7 was cured by batch treatment by putting the module in an oven, but it can be done in the same equipment simultaneously with joining in the method of the embodiment, and therefore the cycle time of production line of the semiconductor element 1 can be shortened.

(Embodiment 5)

A mounting method of semiconductor element in embodiment 5 of the invention is described below while referring to FIG. 11.

Figure 11:
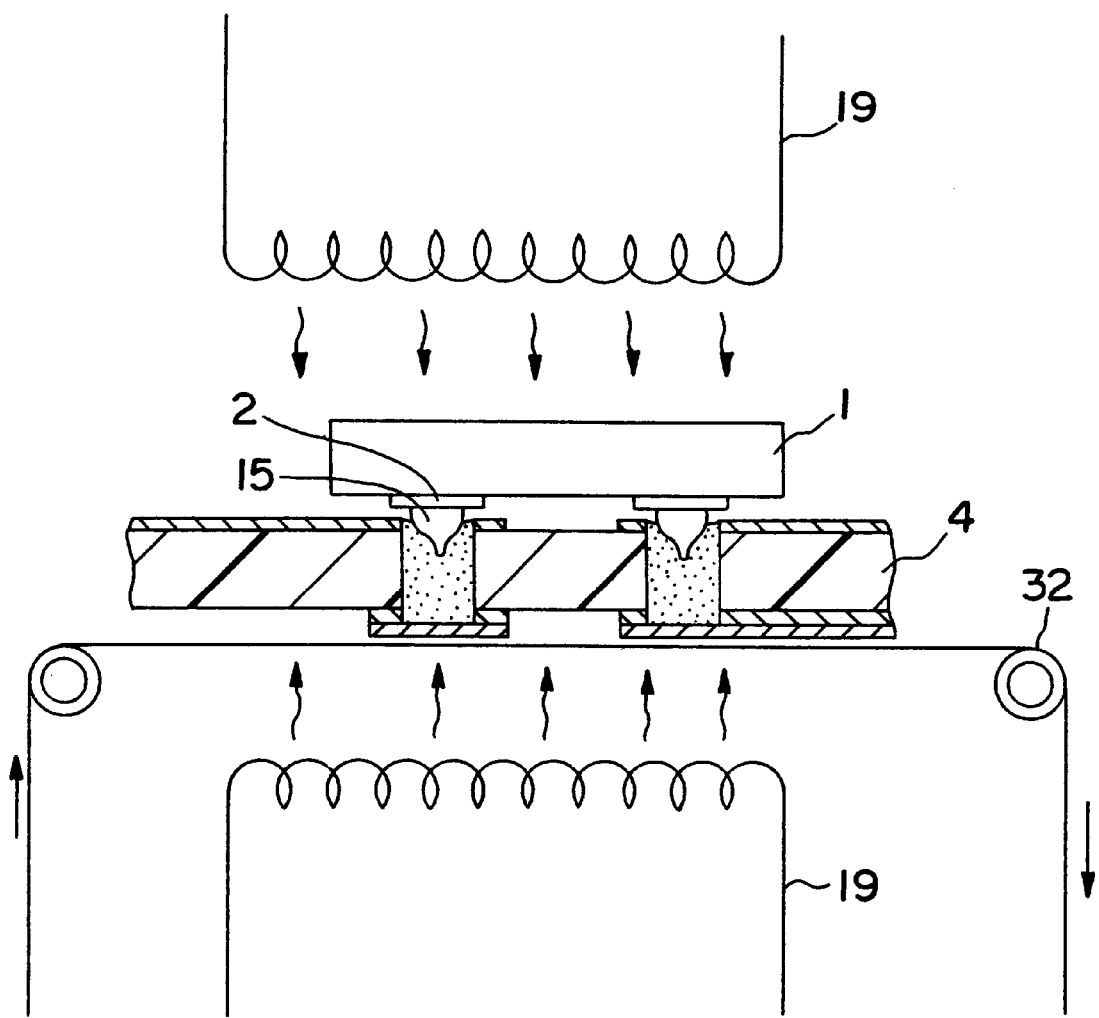
FIG. 11 is a diagram showing mounting steps sequentially in embodiment 5 of the invention.

In FIG. 11, in embodiment 5, a semiconductor element 1 is pressed, and a conductive paste 7 in a hole 8 of a circuit board 4 is brought into contact with a protruding bump 15 on an electrode 2 of the semiconductor element 1, a module (circuit board 4 and semiconductor element 1) is put on a conveyor 32, and the entire module is heated by a heater 19 while moving, so that the conductive paste 7 is cured.

According to this embodiment 5, in addition to the effects of the foregoing embodiments 1 and 2, by curing the conductive paste 7 in the reflow method by putting the entire module on the conveyor 32 and heating while moving, and hence it is possible to cure in the same production line as mounting. Therefore, without causing effect on the cycle of the production line of semiconductor element 1, fixing of semiconductor element 1 and circuit board 4 is made stronger, so that junction of higher reliability is realized.

(Embodiment 6)

A mounting method of semiconductor element in embodiment 6 of the invention is described below while referring to FIG. 12.

Figure 12:
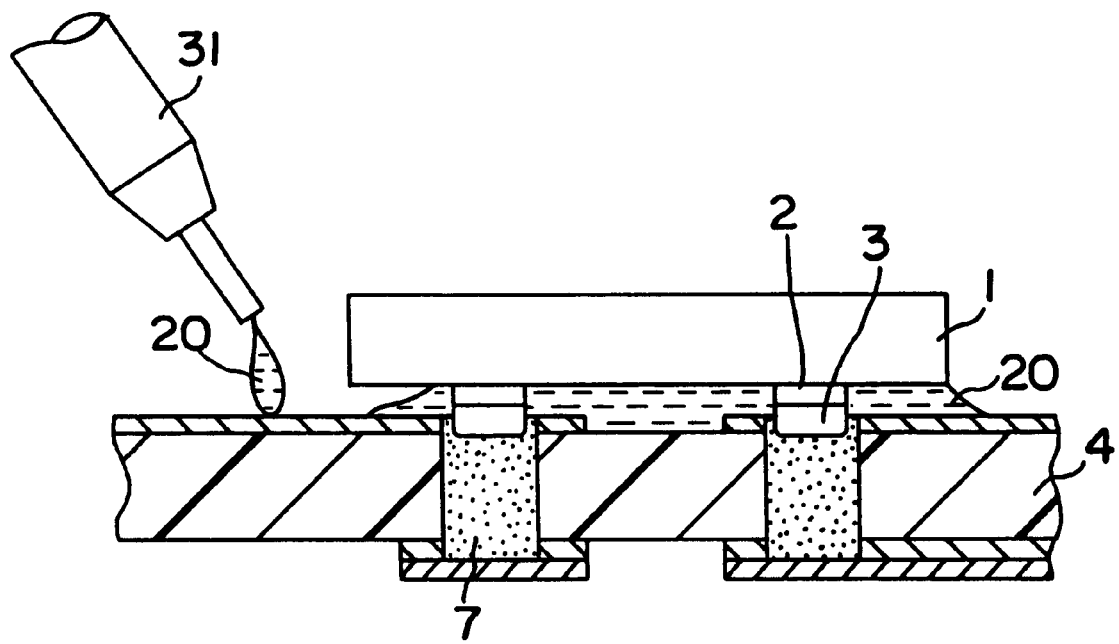
FIG. 12 is a diagram showing mounting steps sequentially in embodiment 6 of the invention.

As shown in FIG. 12, in the mounting process in embodiments 1 to 5, after mounting a semiconductor element 1 on a circuit board 4, the space between the semiconductor element 1 and circuit board 4 is filled with an epoxy resin 20 by using a syringe 31.

Figure 13:
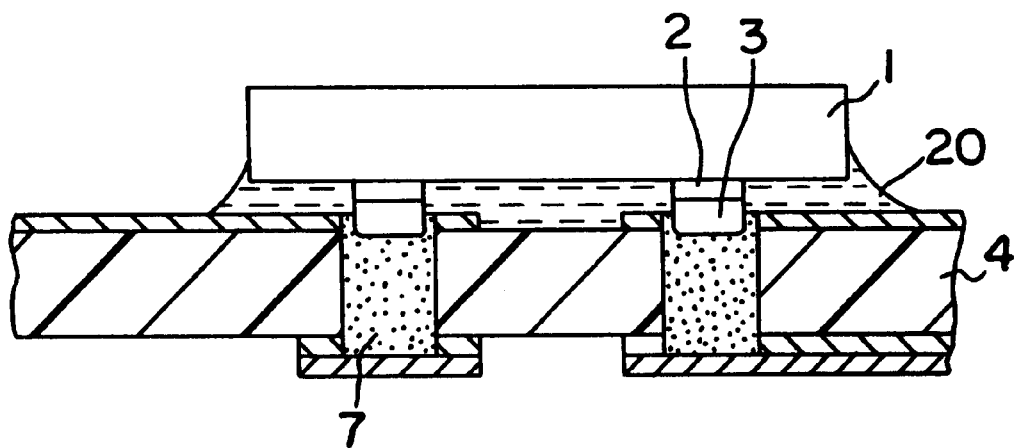
FIG. 13 is a junction sectional view of a semiconductor element and a circuit board after mounting in embodiment 6 of the invent ion.

According to this embodiment 6, in addition to the effects of the foregoing embodiments 1 through 5, as shown in FIG. 13, by filling with the epoxy resin 20, the active surface of the semiconductor element 1 and the surface of the electrode 2 are protected. Therefore, if the module is exposed, for example, to environments of high temperature and high humidity, corrosion of the electrode 2 and protruding bump 3 can be prevented, so that connection of high reliability is guaranteed.

(Embodiment 7)

A mounting method of semiconductor element in embodiment 7 of the invention is described below while referring to FIG. 14.

Figure 14A:
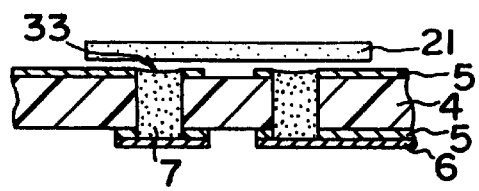
FIGS. 14(a)–14(d) is a diagram showing mounting steps sequentially in embodiment 7 of the invention.

First, as shown in FIG. 14(a), a hole 8 in a circuit board 4 is filled with a conductive paste 7 to form an external electrode terminal 33, and an adhesive sheet 21 having a thermosetting resin, a thermoplastic resin, or a mixed thermosetting and thermoplastic resin is disposed on the circuit board 4.

It is also possible to disperse particles of nickel, solder, carbon, or gold plated plastic uniformly on the adhesive sheet 21.

Figure 14B:
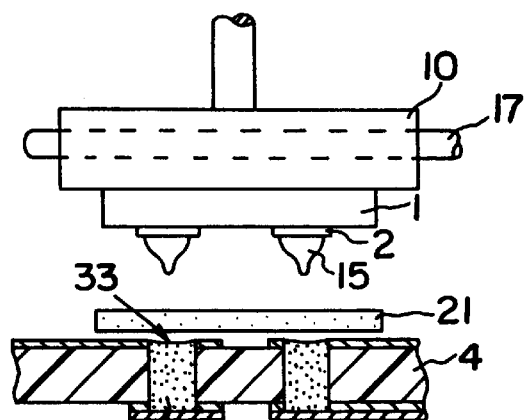

Next, as shown in FIG. 14(b), a semiconductor element 1 is attracted to a suction nozzle 10, and is positioned to an external electrode terminal 33 of the circuit board 4 forming a protruding bump 15 by the conductive paste 7 filling up the hole 8.

Figure 14C:
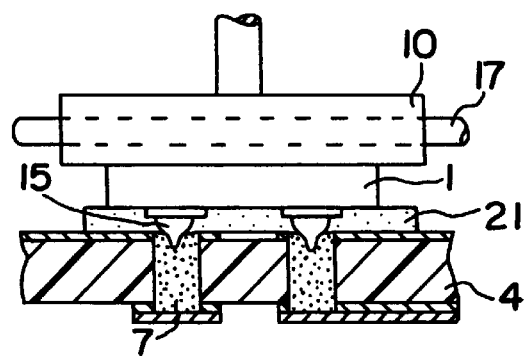

Then, as shown in FIG. 14(c), by pressing the semiconductor element 1, the adhesive sheet 21 is torn off by the protruding bump 15, and the protruding bump 15 is buried in the conductive paste 7. At this time, the suction nozzle 10 is heated by an incorporated heater 17, and the adhesive sheet 21 is melted and cured simultaneously with pressing.

Figure 14D:
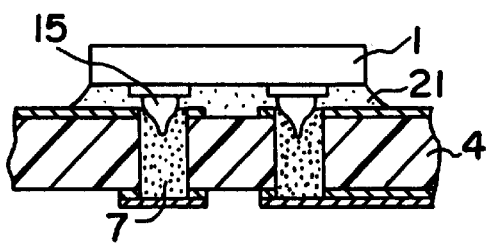

According to this embodiment 7, in addition to the effects of the foregoing embodiments 1 and 2, as shown in FIG. 14(d), the adhesive sheet 21 is melted and cured, and the active surface of the semiconductor element 1 and the surface of the electrode 2 are protected, so that the reliability of connection is further increased. Moreover, when using the adhesive sheet 21, the time required for pressing and curing is about 30 seconds, whereas the curing time of epoxy resin in the prior art is about 4 hours, and therefore the curing time in the embodiment is very short, and the cycle time of production line of semiconductor element 1 can be shortened.

(Embodiment 8)

A mounting method of semiconductor element in embodiment 8 of the invention is described below while referring to FIG. 15.

Figure 15A:
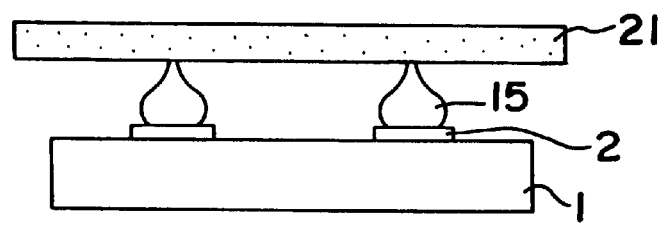
FIGS. 15(a)–15(b) is a diagram showing mounting steps sequentially in embodiment 8 of the invention.

First, as shown in FIG. 15(a), after forming a protruding bump 15 on an electrode 2 of a semiconductor element 1, an adhesive sheet 21 having a thermosetting resin, a thermoplastic resin, or a mixed thermosetting and thermoplastic resin is disposed preliminarily on the protruding bump 15. It is also possible to disperse particles of nickel, solder, carbon, or gold plated plastic uniformly on the adhesive sheet 21.

Figure 15B:
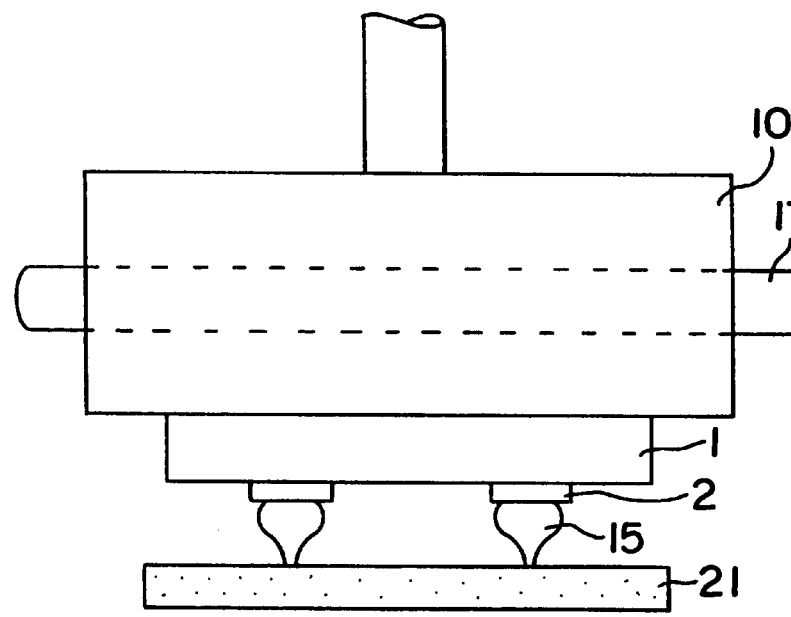
Figure 15B:
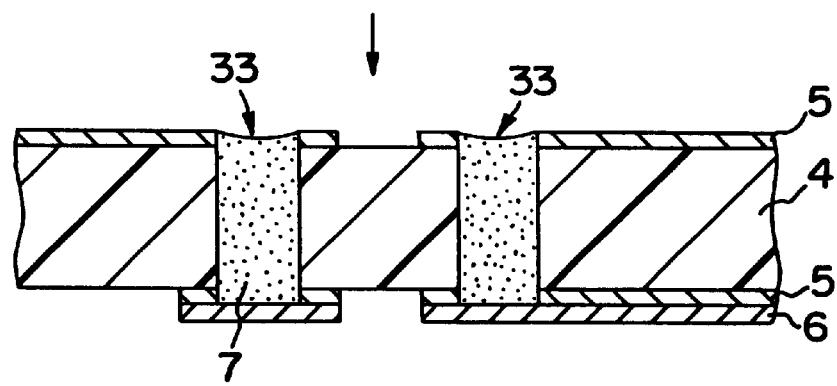

Next, as shown in FIG. 15(b), the semiconductor element 1 is attracted to a suction nozzle 10, and is positioned to an external electrode terminal 33 of a circuit board 4 forming the protruding bump 15 by a conductive paste 7 filling up a hole 8, and by pressing, the adhesive sheet 21 is torn off by the protruding bump 15, and the protruding bump 15 is buried in the conductive paste 7. At this time, the suction nozzle 10 is heated by an incorporated heater 17, and the adhesive sheet 21 is melted and cured simultaneously with pressing.

According to this embodiment 8, in addition to the effects of the foregoing embodiments 1 and 2, same as in embodiment 7, the adhesive sheet 21 is melted and cured, and the active surface of the semiconductor element 1 and the surface of the electrode 2 are protected, so that the reliability of connection is further increased. Moreover, when using the adhesive sheet 21, the time required for pressing and curing is about 30 seconds, whereas the curing time of epoxy resin in the prior art is about 4 hours, and therefore the curing time in the embodiment is very short, and the cycle time of production line of semiconductor element 1 can be shortened.

INDUSTRIAL APPLICABILITY

Therefore, according to the invention, by bringing the protruding bump formed on the electrode of the semiconductor element into contact with the conductive paste in the hole in the circuit board, and connecting the electrode of the semiconductor element and the external electrode terminal of the circuit board electrically, a short circuit between electrodes can be avoided, and the tolerable range for warping and curving of the circuit board is wide, so that an open state between the electrodes can be avoided, and mounting of high electrical reliability is realized.

Moreover, by preliminarily disposing the adhesive sheet on the circuit board or the protruding bump of the semiconductor element, tearing off the adhesive sheet at the time of mounting so that the protruding bump may contact with the conductive paste in the circuit board hole to connect electrically, and melting and curing the adhesive sheet, the active surface of the semiconductor element and the surface of the electrode can be protected by the adhesive sheet, and therefore the reliability of the connection is increased. Further, when using the adhesive sheet, the time required for pressing and curing is about 30 seconds, whereas the curing time of epoxy resin in the prior art is about 4 hours, and therefore the curing time in the embodiment is very short, and the time for the sealing process is notably saved, so that the cycle time of production line of semiconductor element can be shortened.

I claim:

1. A method of mounting a semiconductor element comprising:

forming a hole in a circuit board for connecting a circuit which is disposed on at least a front surface of said circuit board and a protruding bump on an electrode of the semiconductor element, affixing an external electrode terminal on the circuit board, opposite the front surface, for closing a side of said hole, filling said hole with a conductive paste for electrically connecting said external electrode terminal and said circuit on said front surface, positioning said protruding bump of said semiconductor element with said hole filled with said conductive paste, said semiconductor element being placed facing said front surface, pressing said semiconductor element to contact said conductive paste filled in said hole, thereby electrically connecting said electrode of said semiconductor element and said external electrode terminal of said circuit board; and heating at least one of said semiconductor element and said circuit board for curing said conductive paste.

2. A mounting device including a semiconductor element comprising:

a semiconductor element having a protruding bump on an electrode thereof, a circuit board having a hole therethrough in a position for connecting said protruding bump of said semiconductor element, an external electrode terminal on the circuit board, opposite the front surface, for closing a side of said hole, a connecting terminal formed at said hole, said connecting terminal being formed by filling a conductive paste in said hole, and an adhesive sheet selected from the group consisting of a thermosetting resin, a thermoplastic resin and a mixed thermosetting and thermoplastic resin disposed on said circuit board forming said connecting terminal and said protruding bump of said semiconductor element;

wherein said adhesive sheet is penetrated through by said protruding bump, said conductive paste in said hole in contact with said protruding bump, said electrode of said semiconductor element is electrically connected to said connecting terminal of said circuit board, and said conductive paste is heat cured.

3. A mounting device including a semiconductor element comprising:

a semiconductor element having a protruding bump on an electrode thereof, a circuit board having a hole therethrough in a position for connecting said protruding bump of said semiconductor element, an external electrode terminal on the circuit board, opposite the front surface, for closing a side of said hole; and a connecting terminal forming at said hole, said connecting terminal being formed by filling a conductive paste in said hole, wherein said protruding bump is buried into said conductive paste in said hole, said electrode of said semiconductor element is electrically connected to said connecting electrode, said external electrode terminal of said circuit board, and said circuit, and said conductive paste is heat cured.

4. A method of mounting a semiconductor element comprising the steps of:

filling a hole with a conductive paste, the hole in a substrate for connecting a circuit which is disposed on at least a surface of said substrate and a protruding bump on an electrode of the semiconductor element, positioning said protruding bump relative to said hole, pressing said semiconductor element so that said protruding bump contacts said conductive paste; and heating at least one of said semiconductor element and said substrate for curing said conductive paste.

5. A method of mounting a semiconductor element comprising the steps of:

filling a hole with a conductive paste, the hole in a substrate for connecting a circuit which is disposed on at least a surface of said substrate and a protruding bump on an of the semiconductor element, positioning said protruding bump relative to said hole, pressing said semiconductor element so that said protruding bump is buried in said conductive paste; and heating at least one of said semiconductor element and said substrate for curing said conductive paste.

6. The method of mounting a semiconductor element of claim 4, further comprising the step of:

pouring an epoxy resin into a space between said semiconductor element and said substrate, after the step of pressing.

7. The method of mounting a semiconductor element of claim 4, wherein said substrate is a multi-layer substrate.

8. A circuit board, comprising:

a substrate, a semiconductor element having a protruding bump on an electrode and mounted on said substrate; and said substrate having a hole in a position for connecting said protruding bump with a circuit which is disposed on at least a surface of said substrate, the hole filled with conductive paste, wherein said protruding bump contacts said conductive paste, and the conductive paste is heat cured.

9. A circuit board, comprising:

a substrate a semiconductor element having a protruding bump on an electrode and mounted on said substrate; and said substrate having a hole for connecting said protruding bump with a circuit which is disposed on at least a surface of said substrate, the hole filled with conductive paste, wherein said protruding bump is buried in said conductive paste, the conductive paste is heat cured.

10. The circuit board of claim 8, further comprising:

an epoxy resin sealed in a space between said semiconductor element and said substrate.

11. The circuit board of claim 8, wherein said substrate is a multi-layer substrate.

12. The circuit board of claim 8, further comprising:

an adhesive sheet selected from the group consisting of a thermosetting resin, a thermoplastic resin and a mixed thermosetting and thermoplastic resin, disposed between said substrate and said semiconductor element.

* * * * *

UNITED STATES PATENT AND TRADEMARK OFFICE
CERTIFICATE OF CORRECTION

PATENT NO. : 6,531,022 B1  Page 1 of 1
DATED : March 11, 2003
INVENTOR(S) : Norihito Tsukahara It is certified that error appears in the above-identified patent and that said Letters Patent is hereby corrected as shown below:

Column 11,
Line 35, after "bump on an" insert -- electrode --.

Signed and Sealed this

Sixteenth Day of September, 2003

JAMES E. ROGAN
*Director of the United States Patent and Trademark Office*